United States Patent
Tseng et al.

(10) Patent No.: US 7,718,078 B2
(45) Date of Patent: May 18, 2010

(54) MANUFACTURING METHOD OF CIRCUIT BOARD

(75) Inventors: Chi-Chao Tseng, Hsinchu (TW); Ming-Loung Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 895 days.

(21) Appl. No.: 11/520,764

(22) Filed: Sep. 14, 2006

(65) Prior Publication Data

US 2007/0287285 A1 Dec. 13, 2007

(30) Foreign Application Priority Data

Jun. 8, 2006 (TW) .............................. 95120433 A

(51) Int. Cl.
*H01B 13/00* (2006.01)
(52) U.S. Cl. ............................. 216/18; 216/13; 216/17

(58) Field of Classification Search ................... 216/13, 216/17, 18, 19, 33; 29/830, 846, 848, 825
See application file for complete search history.

(56) References Cited

U.S. PATENT DOCUMENTS

2005/0251997 A1 * 11/2005 Homg et al. ................... 29/830
2006/0175084 A1 * 8/2006 Okamoto et al. ............ 174/262

* cited by examiner

*Primary Examiner*—Lan Vinh
(74) *Attorney, Agent, or Firm*—Rabin & Berdo, P.C.

(57) ABSTRACT

A manufacturing method of a circuit board is provided. Firstly, a substrate board having a plurality of through holes is provided. Next, a first metal layer is electro-less plated on the surface of the substrate board and the surface of the through holes. Then, a second metal layer is plated on the first metal layer. After that, the second metal layer and the first metal layer are patterned to form a patterned circuit layer. Lastly, a third metal layer is plated on the patterned circuit layer.

13 Claims, 9 Drawing Sheets

MANUFACTURING METHOD OF CIRCUIT BOARD

This application claims the benefit of Taiwan application Serial No. 095120433, filed Jun. 8, 2006, the subject matter of which is incorporated herein by reference.

BACKGROUND OF THE INVENTION

1. Field of the Invention

The invention relates in general to a manufacturing method of a circuit board, and more particularly to a method of manufacturing a circuit board having a circuit pattern by double plating.

2. Description of the Related Art

The manufacturing process of a semiconductor element is divided into front-end process and rear-end process. The manufacturing process before sawing a wafer into a chip is referred as the front-end process, while the manufacturing process after sawing a wafer into a chip is referred as the rear-end process. During the rear-end process, the chip is packaged to form a package structure. The chip bonding technology and the micro-system interconnecting technology are applied to the package structure for bonding and connecting the chip and other elements on a circuit board and stretching the leads out, and a plastic insulant is applied for packaging and fixing the package structure.

Of the package structure, the circuit board is used for carrying and fixing an electronic element, and a circuit pattern is formed on the surface of the circuit or inside the circuit board for connecting circuits. Meanwhile, the circuit board can be used for conducting the heat, and separating and protecting the elements. The conventional manufacturing process of a circuit board is elaborated below by accompanied drawings.

Referring to FIGS. 1A~1G, a conventional process of manufacturing a circuit board is shown. Firstly, proceed to FIG. 1A, a substrate board 190 including a copper layer 191 and an insulation layer 192 is provided.

Next, proceed to FIG. 1B, catalyst treatment is applied to the surface of the circuit board, and a first metal layer 110 is electro-less plated thereon. The first metal layer 110 is used as an electrode for subsequent plating.

Then, proceed to FIG. 1C, the first metal layer 110 is used as an electrode, and a second metal layer 120 is plated on the first metal layer 110 totally. In the present step, the thickness of second metal layer 120 is equal to the thickness of a required circuit pattern.

Next, proceed to FIG. 1D, a dry film of photo-resist layer 150 is pasted on the second metal layer 120.

Then, proceed to FIG. 1E, the photo-resist layer 150 is patterned according to the required circuit pattern.

Next, proceed to FIG. 1F, the patterned photo-resist layer 150 is used as a mask, and the second metal layer 120, the first metal layer 110 and the copper layer 191 are etched to form a patterned circuit layer 140.

Then, proceed to FIG. 1G, the photo-resist layer 150 is removed. Thus, a circuit board 100 having the required circuit pattern is formed.

The etching process of FIG. 1F normally has to take the following parameters into consideration: the material to be etched, etching rate, etching time, etching thickness, etching selectivity, and etching concentration. The formula for etching rate is expressed as: etching rate=etching thickness÷etching time. And etching selectivity refers to the ratio of etching rate between different materials to be etched, especially the materials to be removed and the material not to be removed. Examples to the material to be removed are second metal layer 120, the first metal layer 110, and the copper layer 191. Examples to the material not to be removed is the insulation layer 192. Normally, the etching process can be divided into isotropic etching and anisotropic etching. The isotropic etching normally has a high etching selectivity such as wet etching, while the anisotropic etching has a lower etching selectivity such as dry etching.

In the step of forming the patterned circuit layer 140, the isotropic etching is applied.

Referring to FIGS. 2A~2C, the etching process of FIG. 1F is shown. As shown in FIG. 2A, the isotropic etching may not only etch downwards but also etch horizontally towards the metal layer underneath the photo-resist layer 150. In the etching process, under the photo-resist layer 150, a part of the second metal layer 120, the first metal layer 110 and the copper layer 191 on the surface of the substrate board 190 are also horizontally etched to form a larger circuit clearance D140 as shown in FIG. 2C and FIG. 1G. Furthermore, the part of the circuit layer 140 with narrower width may disappear after horizontal etching.

Thus, the conventional manufacturing method of circuit board is incapable of effectively controlling the expansion of the circuit clearance. Moreover since the part of the circuit layer with narrower width may disappear after horizontal etching, the precision of the circuit board is largely restricted.

SUMMARY OF THE INVENTION

It is therefore an object of the invention to provide a manufacturing method of a circuit board whose circuit layer is formed by double plating for the manufacturing method of circuit board to achieve better precision.

The invention achieves the above-identified object by providing a manufacturing method of a circuit board. Firstly, a substrate board having a plurality of through holes is provided. Next, a first metal layer is electro-less plated on the surface of the substrate board and the surface of the through holes. Then, a second metal layer is plated on the first metal layer. After that, the second metal layer and the first metal layer are patterned to form a patterned circuit layer. Lastly, a third metal layer is plated on the patterned circuit layer.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
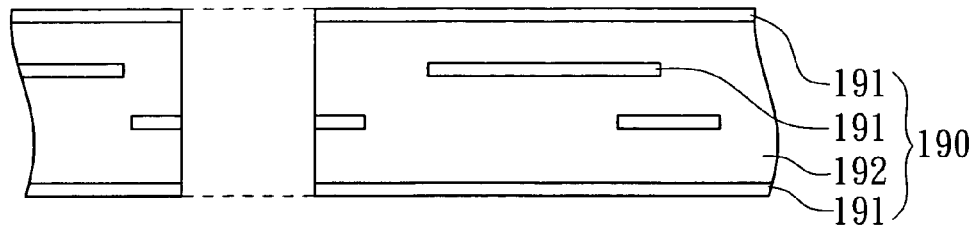
FIGS. 1A~1G (Prior Art) are a conventional process of manufacturing a circuit board.
Figure 1B:
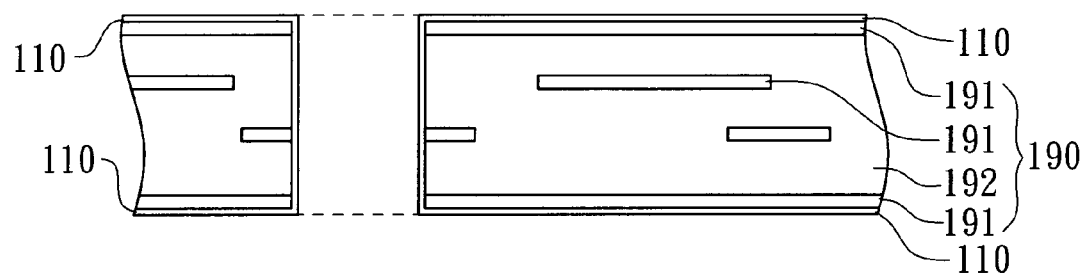
Figure 1C:
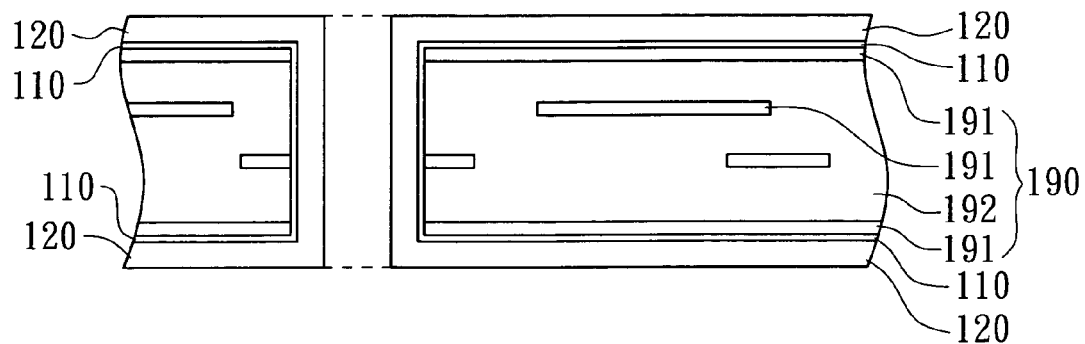
Figure 1D:
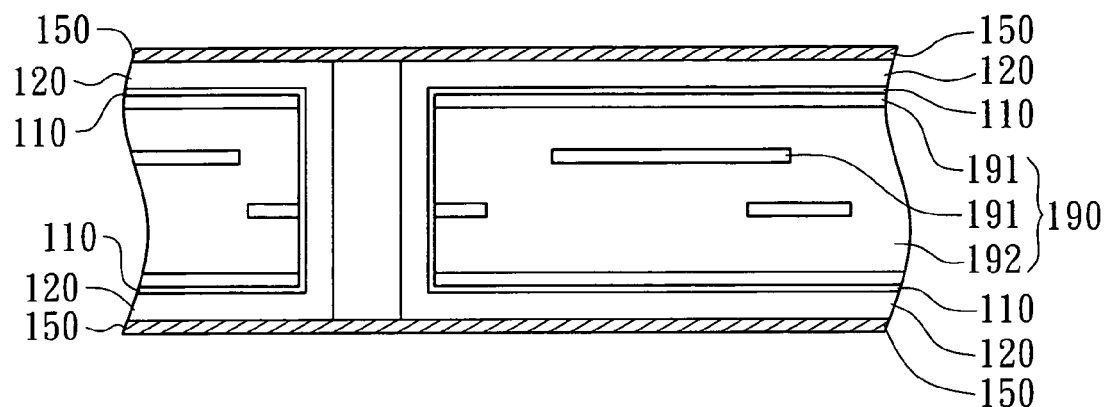
Figure 1E:
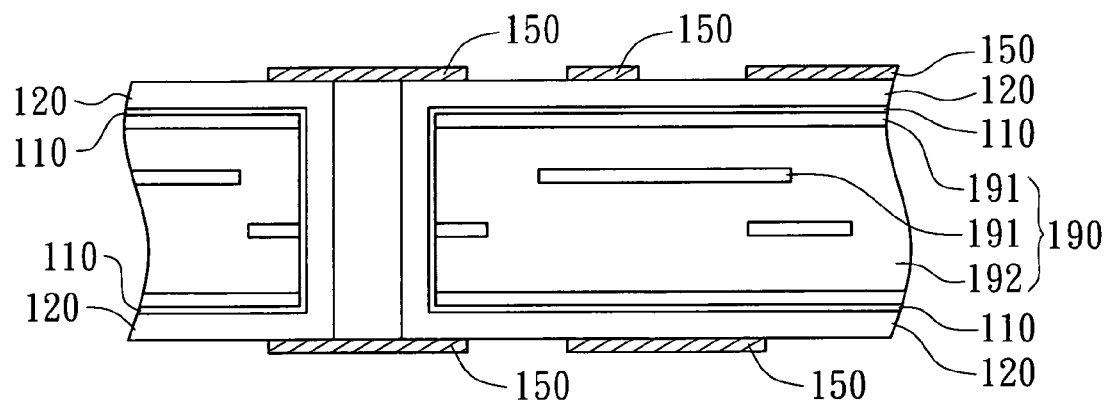
Figure 1F:
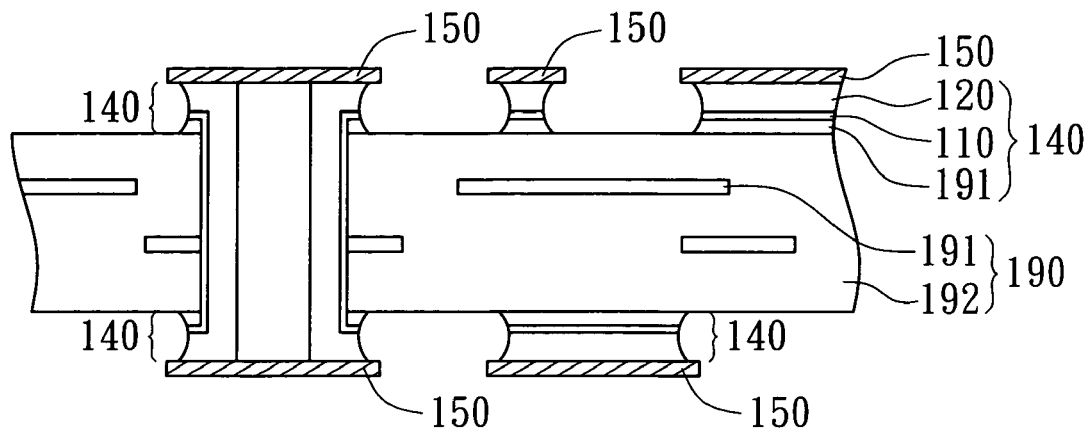
Figure 1G:
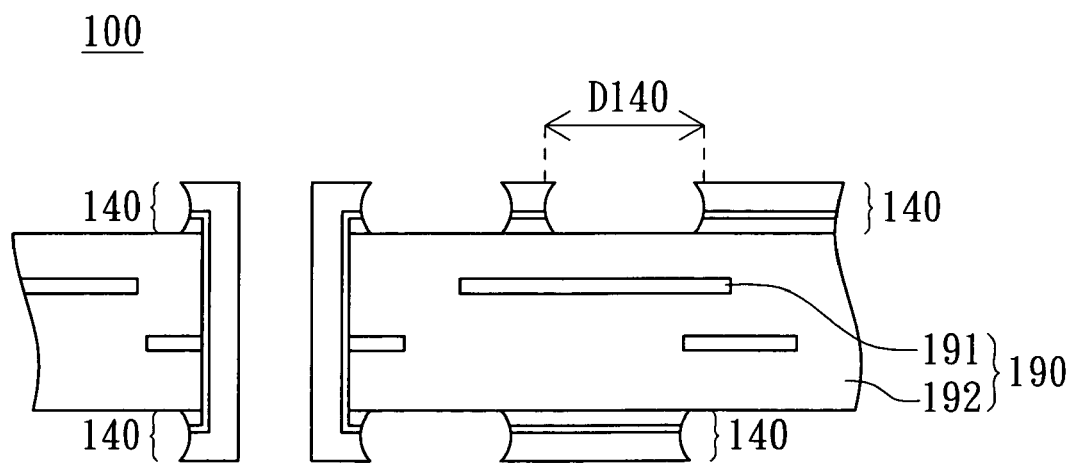
Figure 2A:
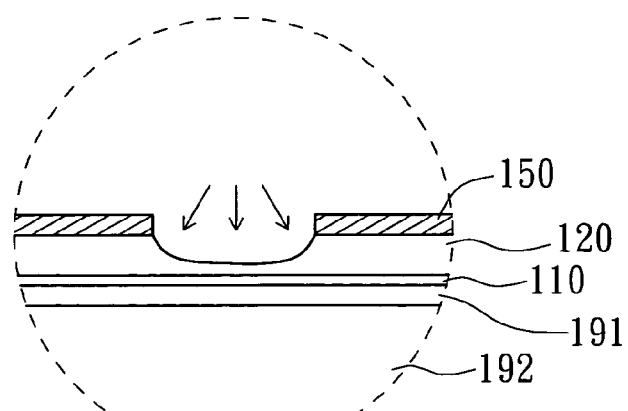
FIGS. 2A~2C (Prior Art) illustrate the etching process of FIG. 1F.
Figure 2B:
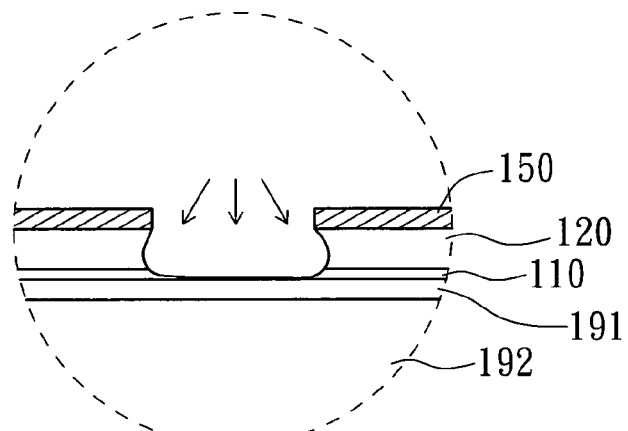
Figure 2C:
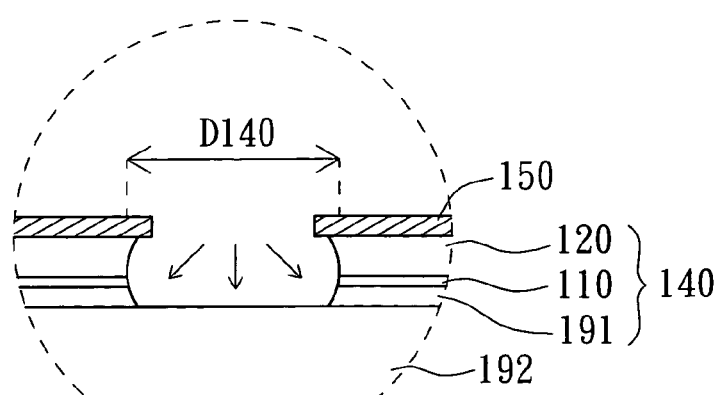
Figure 3:
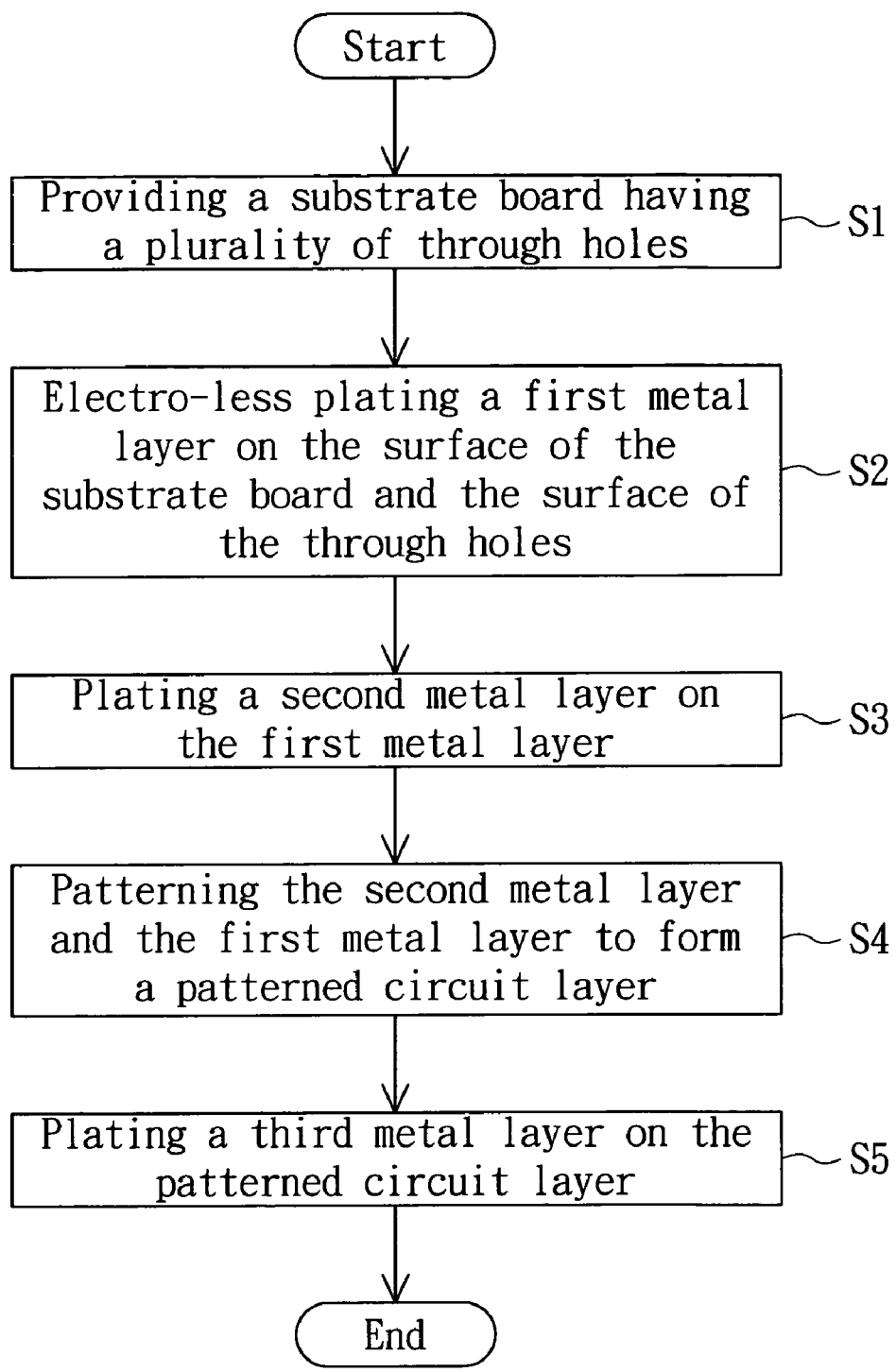
FIG. 3 is a manufacturing flowchart of the circuit board according to a preferred embodiment of the invention.

Referring to both FIG. 3 and FIGS. 4A~4H. FIG. 3 is a manufacturing flowchart of the circuit board according to a preferred embodiment of the invention. FIGS. 4A~4H illustrate each step of FIG. 3. In the present embodiment of the invention, the circuit board is used for carrying the package substrate of a chip. However, the manufacturing method of the invention is also applicable to the circuit board of other purposes, and the purpose of the circuit board is not to limit the scope of technology of the invention.

Figure 4A:
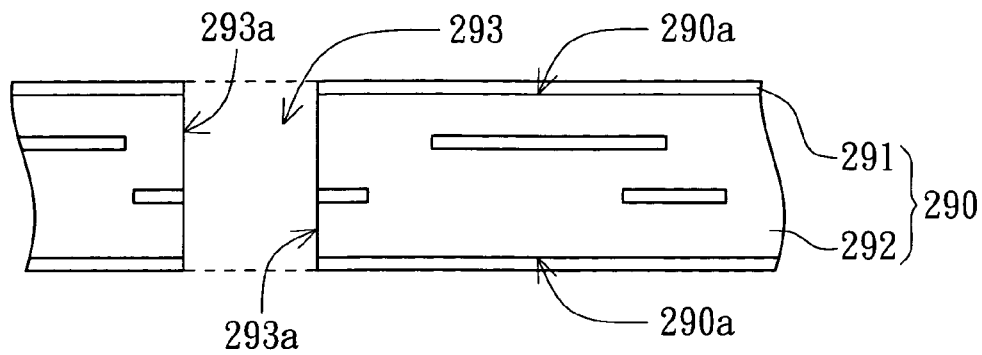
FIGS. 4A~4H illustrate each step of FIG. 3.

Firstly, proceed to the step S1 of FIG. 3 as shown in FIG. 4A, a substrate board 290 having a plurality of through holes 293 is provided. In the present embodiment of the invention, the substrate board 290 includes a copper layer 291, an insulation layer 292 and a plurality of through holes 293. The substrate board 290 is a double-layered or multi-layered board having at least an inner circuit layer. The through holes 293 penetrate the copper layers 291 disposed on the top surface and the bottom surface of the substrate board 290.

The present step of forming the substrate board 290 includes forming the copper layer 291 on the surface 290a of substrate board 290 and forming the plurality of through holes 293 which penetrate through the substrate board 290 and the copper layers 291. The through holes 293 may be formed according to Laser drilling method or mechanical drilling method. In the present step, the wall of the through holes 293 does not have any conductive thin film, neither does the copper layers 291 have any circuit pattern.

Figure 4B:
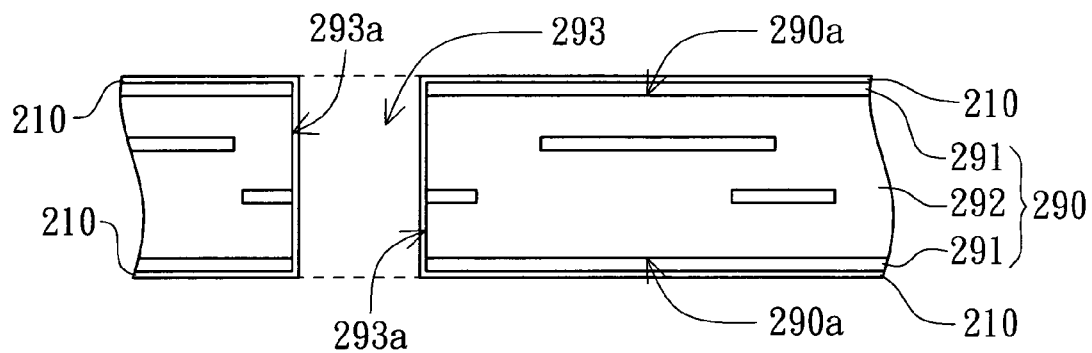

Next, proceed to the step S2 of FIG. 3 as shown in FIG. 4B, a first metal layer 210 is electro-less plated on the surface 290a of the substrate board 290 and the surface 293a of the through holes. The first metal layer 210 is used as an electrode for subsequent plating. The first metal layer 210 is made from a conductive metal such as copper (Cu) or nickel-gold (Ni/Au) alloy.

Since the first metal layer 210 is merely used as an electrode for subsequent plating and the speed of the electro-less plating of the first metal layer 210 is very slow, the present step only has to form a thin layer of the first metal layer 210 as an electrode for subsequent plating.

Figure 4C:
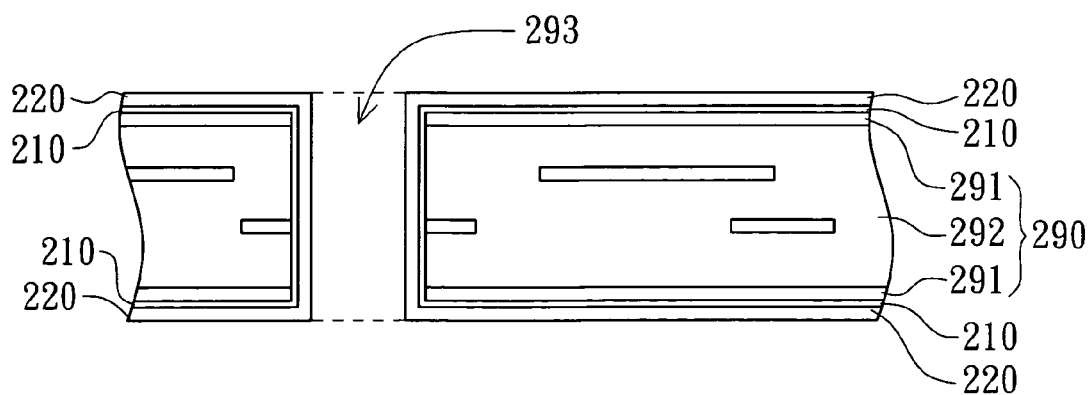

Then, proceed to the step S3 of FIG. 3 as shown in FIG. 4C, a second metal layer 220 is plated on the first metal layer 210. The present step uses the first metal layer 210 as an electrode for plating the second metal layer 220 on the first metal layer 210.

Figure 4D:
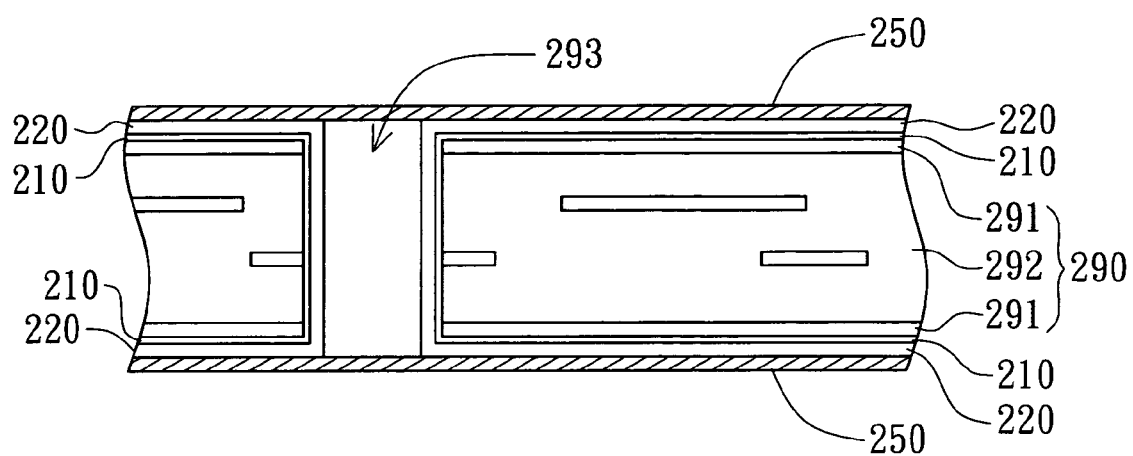
Figure 4E:
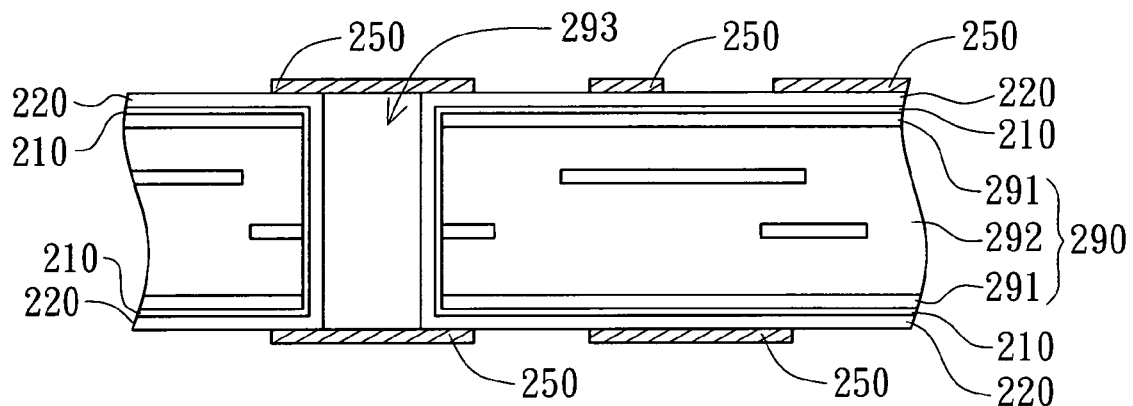
Figure 4F:
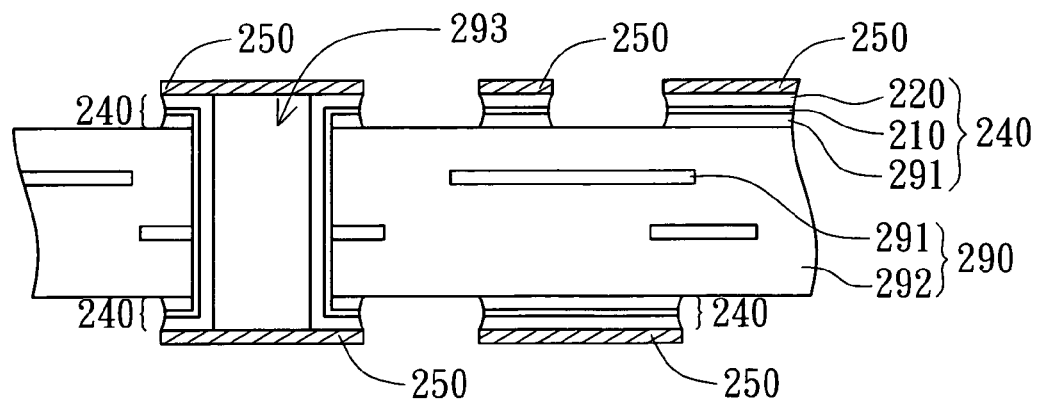
Figure 5:
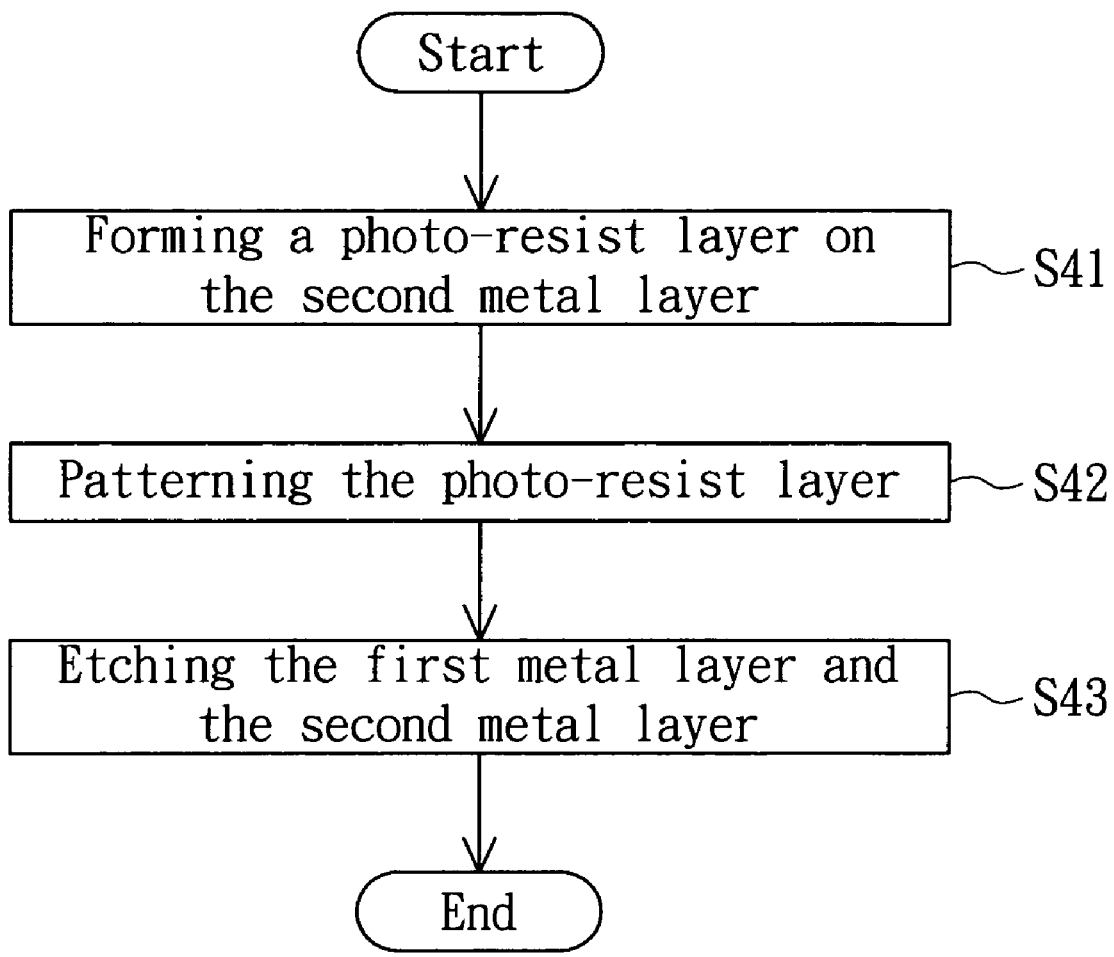
FIG. 5 is a flowchart of the sub-steps of forming the patterned circuit layer.

Next, proceed to the step S4 of FIG. 3 as shown in FIGS. 4D~4G, the second metal layer 220 and the first metal layer 210 are patterned to form a patterned circuit layer 240. The step of forming the patterned circuit layer 240 further includes the following sub-steps:

Referring to FIG. 5, a flowchart of the sub-steps of forming the patterned circuit layer is shown. Proceed to the step S41 of FIG. 5 as shown in FIG. 4D, a photo-resist layer 250 is formed on the second metal layer 220.

Next, proceed to the step S42 of FIG. 5, the photo-resist layer 250 is patterned.

Then, proceed to the step S43 of FIG. 5, the patterned photo-resist layer 250 is used as a mask, and the first metal layer 210, the second metal layer 220 and the copper layers 291 on the surface of the substrate board 290 are etched to form the patterned circuit layer 240.

Figure 4G:
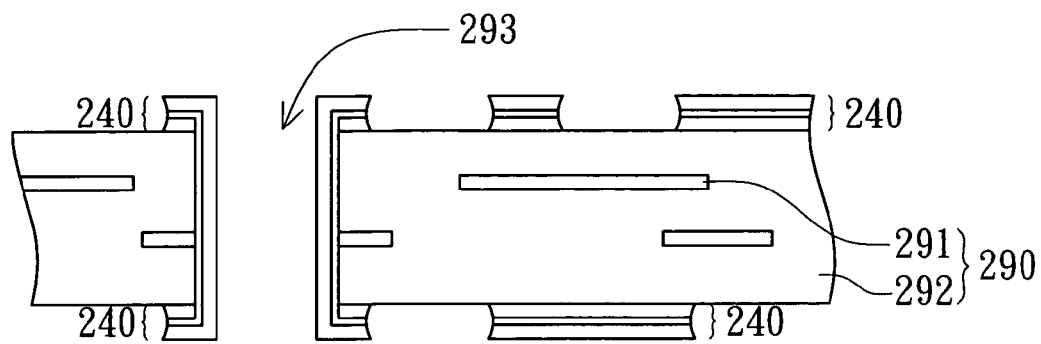

In the present embodiment of the invention, the first metal layer 210, the second metal layer 220, and the copper layers 291 on the surface of the substrate board 290 are made from copper (Cu) or nickel-gold (Ni/Au) alloy, while the insulation layer 292 is made from an organic material. The step S43 adopts the isotropic etching process that has better selectivity with respect to metal and organic material, lest the insulation layer might be etched. The isotropic etching process is normally accompanied by horizontal etching, so that the patterned circuit layer 240 has etched sidewalls, as shown in FIG. 4G.

The degree of horizontal etching is proportional to the duration of etching time, and etching time is equal to etching rate multiplied by etching thickness. The thinner the second metal layer 220 is, the less etching time is required and the degree of horizontal etching is effectively reduced.

Figure 4H:
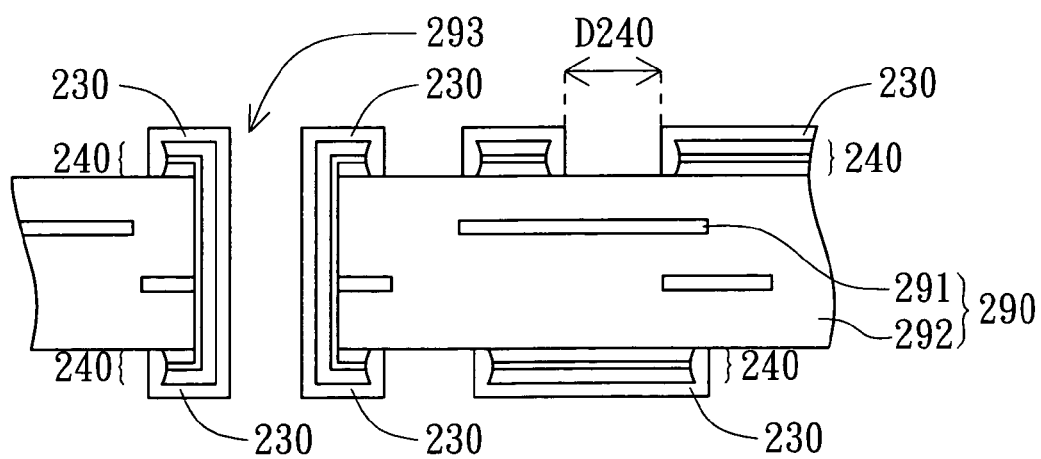

Next, proceed to the step S5 of FIG. 3 as shown in FIG. 4H, a third metal layer 230 is plated on the patterned circuit layer 240. In the present step, the patterned circuit layer 240 is used as an electrode, and the third metal layer 230 is plated to cover on the patterned metal layer 240. Thus, the circuit board 200 of the present embodiment of the invention is formed. The third metal layer 230 is made from copper (Cu) or nickel-gold (Ni/Au) alloy.

As disclosed in the step S3 and step S5, in the manufacturing method of a circuit board of the invention, the second metal layer 220 and the third metal layer 230 are double plated on the substrate board 290. In the step S4 of forming the patterned circuit layer 240, only the second metal layer 220, the first metal layer 210 and the copper layers 291 are etched. The second metal layer 220 is thin and requires less etching time, hence having less horizontal etching.

Moreover, in the step S5, the third metal layer 230 is further plated on the etched patterned circuit layer 240 to cover the etched sidewalls of the patterned circuit layer 240, not only achieving the desired thickness of the circuit pattern required by the circuit board but also filling up part of the patterned circuit layer 240 which is horizontally etched. Therefore, during the manufacturing of the circuit board 200, the patterned circuit layer 240 will not experience the expansion of the circuit clearance D240 or the disappearing any part of the circuit pattern.

Besides, in the steps S3 and S5 of FIG. 3, the plating thickness for the second metal layer 220 and the third metal layer 230 can be adjusted according to actual needs, such that the sum of the thickness of the second metal layer 220 and the thickness of the third metal layer 230 achieves the thickness of circuit pattern required by the circuit board 200.

Despite the circuit board of the invention is exemplified by the package substrate used for carrying a chip in the above embodiments, however, examples of the circuit board of the invention include printed circuit board other circuit boards. Any design or technology avoids the expansion of the circuit clearance or the disappearing of circuit pattern by double plating is within the scope of technology of the invention.

The circuit board manufacturing method disclosed in the above embodiment of the invention is double plated by the second metal layer and the third metal layer to decrease horizontal etching, such that the expansion fo the circuit clearance and the disappearing of the circuit pattern are avoided.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a circuit board, comprising:
providing a substrate board having a plurality of through holes;
electro-less plating a first metal layer on the surface of the substrate board and the surface of the through holes;
plating a second metal layer on the first metal layer;

patterning the second metal layer and the first metal layer to form a patterned circuit layer having etched sidewalls; and plating a third metal layer on the patterned circuit layer, wherein the third metal layer covers the etched sidewalls of the patterned circuit layer.

2. The manufacturing method of circuit board according to claim 1, wherein the circuit board is used for carrying a chip.

3. The manufacturing method of circuit board according to claim 1, further comprising:

forming a copper layer on the surface of the substrate board; and forming the through holes penetrated through the substrate board and the copper layer.

4. The manufacturing method of circuit board according to claim 3, wherein the method of forming the through holes comprises mechanical drilling.

5. The manufacturing method of circuit board according to claim 3, wherein the method of forming the through holes comprises Laser drilling.

6. The manufacturing method of circuit board according to claim 1, wherein the substrate board further has at least an inner circuit layer.

7. The manufacturing method of circuit board according to claim 1, wherein the first metal layer is made from copper.

8. The manufacturing method of circuit board according to claim 1, wherein the method of plating the second metal layer comprises:

plating the second metal layer on the first metal layer used as an electrode.

9. The manufacturing method of circuit board according to claim 1, wherein the method of plating the third metal layer comprises:

plating the third metal layer on the patterned metal layer used as an electrode.

10. The manufacturing method of circuit board according to claim 1, wherein the method of forming the patterned circuit layer comprises:

forming a photo-resist layer on the second metal layer;

patterning the photo-resist layer; and etching the first metal layer and the second metal layer to form the patterned circuit layer, wherein the patterned photo-resist layer is used as a mask.

11. The manufacturing method of circuit board according to claim 1, wherein the patterned circuit layer and the third metal layer are made from copper (Cu).

12. The manufacturing method of circuit board according to claim 1, wherein the patterned circuit layer and the third metal layer are made from nickel-gold alloy (Ni/Au).

13. The manufacturing method of circuit board according to claim 1, wherein the substrate board is a double-layered board or a multi-layered board.

* * * * *